(12) United States Patent
Nakabayashi et al.

(10) Patent No.: US 9,068,277 B2
(45) Date of Patent: Jun. 30, 2015

(54) APPARATUS FOR MANUFACTURING SINGLE-CRYSTAL SILICON CARBIDE

(75) Inventors: Masashi Nakabayashi, Tokyo (JP);
Tatsuo Fujimoto, Tokyo (JP); Hiroshi Tsuge, Tokyo (JP); Masakazu Katsuno, Tokyo (JP); Noboru Ohtani, Sanda (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 965 days.

(21) Appl. No.: 12/416,500

(22) Filed: Apr. 1, 2009

(65) Prior Publication Data

US 2009/0205565 A1 Aug. 20, 2009

(51) Int. Cl.
| | |
|---|---|
| C30B 23/00 | (2006.01) |
| C30B 29/36 | (2006.01) |
| C30B 35/00 | (2006.01) |
| C30B 23/06 | (2006.01) |

(52) U.S. Cl.
CPC ........... *C30B 29/36* (2013.01); *Y10T 117/1068* (2015.01); *C30B 35/00* (2013.01); *C30B 23/00* (2013.01); *C30B 23/066* (2013.01)

(58) Field of Classification Search
CPC ................................ C30B 35/00; C30B 23/00
USPC .................. 118/715, 719, 723 VE, 724, 726; 117/200; 65/347
See application file for complete search history.

(56) References Cited

U.S. PATENT DOCUMENTS

| | | | | |
|---|---|---|---|---|
| 2,462,259 | A | * | 2/1949 | Frei, Jr. .......................... 432/249 |
| 5,968,261 | A | * | 10/1999 | Barrett et al. ..................... 117/13 |
| 2002/0038627 | A1 | * | 4/2002 | Vodakov et al. ................ 117/201 |
| 2003/0089307 | A1 | * | 5/2003 | Wehrhan et al. ............... 117/200 |
| 2005/0000406 | A1 | * | 1/2005 | Janzen et al. ..................... 117/81 |
| 2008/0237609 | A1 | * | 10/2008 | Powell et al. ..................... 257/77 |

FOREIGN PATENT DOCUMENTS

| | | |
|---|---|---|
| JP | 2004-224666 A | 8/2004 |
| JP | 2005-53739 A | 3/2005 |

OTHER PUBLICATIONS

Vodakov et al, US 20020038627 Examiner Annotated Figure 4 (2013).*
Tairov et al., "General Principles of Growing Large-Size Single Crystals of Various Silicon Carbide Polytypes", Journal of Crystal Growth, vol. 52, (1981), pp. 146-150.

(Continued)

*Primary Examiner* — Matthew Song
(74) *Attorney, Agent, or Firm* — Birch, Stewart, Kolasch & Birch, LLP

(57) ABSTRACT

The invention provides an apparatus for manufacturing good quality single-crystal silicon carbide stably without formation of cracks and the like, which apparatus comprises: at least a crucible for accommodating silicon carbide feedstock powder and seed crystal; heat insulation material installed around the crucible; and a heating device for heating the crucible, wherein the outer profile of the crucible includes at least one region of narrower diameter than a vertically adjacent region, insulation material is also installed in the space left by the diameter difference, and thickness of the insulation material at the narrower diameter region is greater than that of the insulation material at the vertically adjacent region. The apparatus for manufacturing single-crystal silicon carbide enables precise control of the temperature gradient inside the crucible, thereby enabling manufacture of good quality single-crystal silicon carbide.

8 Claims, 4 Drawing Sheets

(56) References Cited

OTHER PUBLICATIONS

Neudeck et al., "Performance Limiting Micropipe Defects in Silicon Carbide Wafers", IEEE Electron Device Letters, vol. 15, No. 2, Feb. 1994, pp. 63-65.

Selder et al., "Global modeling of the SiC sublimation growth process: prediction of thermoelastic stress and control of growth conditions", Journal of Crystal Growth, vol. 226, (2001), pp. 501-510.

Nishizawa et al., "High-Quality SiC Bulk Single Crystal Growth based on Simulation and Experiment", Materials Science Forum, vols. 457-460, (2004), pp. 29-34.

* cited by examiner

APPARATUS FOR MANUFACTURING SINGLE-CRYSTAL SILICON CARBIDE

TECHNICAL FIELD

This invention relates to an apparatus for manufacturing single-crystal silicon carbide that enables reliable growth of high-quality single-crystal silicon carbide ingots.

BACKGROUND ART

Single-crystal silicon carbide (SiC) is a wide band gap semiconductor having a broad forbidden band width of 2.2 to 3.3 eV. Owing to its outstanding physical and chemical properties, SiC has long been a focus of R&D for its potential as an environmentally rugged semiconductor material. In recent years, single-crystal SiC has attracted increasing attention as a wafer material for short wavelength optical devices in the blue-to-UV spectral region, high-frequency electronic devices, high-voltage electronic devices and the like, and R&D in these areas has become increasingly active. In the semiconductor field, large-area single crystal of high quality is required for realizing industrial-scale production. However, no technology for reliable supply of large-diameter single-crystal SiC of high-quality has yet been established.

Growth of single-crystal SiC of a size suitable for fabrication of semiconductor devices has been possible on a laboratory scale using, for example, the sublimation growth process (Lely process). However, the single crystal obtained by this method is of small area. In addition, its dimensions, shape, polytype, and carrier concentration are not easy to control. On the other hand, cubic single-crystal SiC is being carried out by heteroepitaxial growth, i.e., growth on a substrate of a different type like silicon (Si), using chemical vapor deposition (CVD). Although large-area single crystal can be obtained using CVD, only single-crystal SiC containing many defects (up to $10^7/cm^2$) can be grown because of, inter alia, the large (about 20%) lattice-mismatch between SiC and Si. That is, high-quality single-crystal SiC cannot be obtained.

The modified Lely process, which conducts sublimation growth using a single-crystal SiC wafer as a seed, was developed to overcome these problems (Yu. M. Tairov and V. F. Tsvetkov, Journal of Crystal Growth, vol. 52 (1981) pp. 146~150). Owing to its use of a seed crystal, the modified Lely process can control the crystal nucleation process and, by controlling the ambient inert gas pressure to around 100 Pa to 15 kPa, can control crystal growth rate with good reproducibility.

The modified Lely process makes it possible to grow single-crystal SiC while controlling its polytype (6H, 4H and 15R and other polytypes), shape, and carrier type and concentration.

Currently, 2-inch (50 mm) to 4-inch (100 mm) single-crystal SiC wafers are being cut from single-crystal SiC grown by the modified Lely process for use in fabricating devices and the like in the power electronics and other sectors. In most cases, however, the crystals are observed to contain micropipes (hollow hole-like defects extending in the longitudinal direction of the crystal) at the rate of up to around $100/cm^2$. Moreover, it is also known that in the conventional single crystal growth methods, polycrystalline SiC growing around the single crystal comes in contact with the single crystal on the seed crystal. This produces strain in the single crystal that degrades its quality. As pointed out in P. G. Neudeck, et al., IEEE Electron Device Letters, vol. 15 (1994) pp. 63-65, the micropipes cause leakage current and other problems in a fabricated device. Mitigation of such drawbacks is the overriding issue in the application of single-crystal SiC in devices.

In order to inhibit such degradation of crystal quality it is important to optimize the temperature gradient in the crucible. A temperature gradient whereby the peripheral region of the growth ingot is higher than its interior is known to be effective. Moreover, as reported in M. Selder, et al., Journal of Crystal Growth, vol. 226 (2001) pp. 501-510, the temperature gradient of a single-crystal ingot generates thermal stress inside the crystal. This thermal stress poses a major problem if large, because it may induce dislocation defects and cause ingot cracking. Precise control of the temperature gradient inside the crucible is therefor essential for obtaining a good-quality single-crystal SiC ingot by the sublimation growth process.

Up to now, the method most generally used to control the temperature gradient in the crucible in the sublimation growth process has been to regulate the positional relationship between the crucible and the induction coil. However, this method not only changes the temperature gradient at the crystal growth zone but also simultaneously changes the crystal and feedstock temperature gradient and the point of maximum crucible temperature. This makes precise temperature gradient control difficult. For example, when the crucible is positioned near the middle of the induction coil in an attempt to increase the temperature at the growth surface by this method, feed gas ceases to be supplied in the direction of the seed crystal, so that growth is interrupted and the crystal surface carbonizes.

A solution to this problem is taught by Japanese Patent Publication (A) No. 2004-224666, for example. The invention of this publication is directed to fine control of the crucible internal temperature by disposing multiple induction coils equipped with resonant inverters at the crucible seed substrate region, intermediate region and SiC powder material region. However, the invention has not been able to achieve its purpose of finely and independently controlling the feedstock and growth crystal because the induction coils also affect the heating of regions adjacent to the crucible.

S. Nishizawa, et al., Materials Science Forum, Vols. 457-460 (2004) pp. 29-34 and Japanese Patent Publication (A) No. 2005-53739 teach prevention of generation of polycrystal from the vicinity of the growth crystal by using the internal structure of the crucible to control temperature gradient and simultaneously forming a flow of sublimation gas at the ingot periphery. Although the method proposed by these references produces good-quality single crystal it is inferior in productivity because the single-crystal ingot inevitably assumes a shape of large diameter in the growth direction and, therefore, the length of crystal having the desired diameter is slight or extensive processing of the outer shape is necessary to give it the required diameter.

Some degree of control of the temperature gradient of the crucible interior is also possible by the simple method of locally increasing the thickness of the heat insulation material installed around the crucible. However, this method cannot finely control temperature of the crucible interior because it regulates only the radiation of heat from the outer wall of the crucible.

SUMMARY OF THE INVENTION

The present invention was accomplished in light of the aforesaid circumstances and has as its object to provide an apparatus for manufacturing high-quality single-crystal silicon carbide very low in crystal defects, which apparatus finely controls the temperature gradient of the crucible interior using a method independent of the positional relationship between the crucible and the coil and of the structure of the crucible interior and using an ordinary induction heating device.

The inventors sought to solve the problems mentioned in the foregoing by pursuing a research and development approach of carrying out thermal distribution analysis by the finite element method and then verifying the results of the analysis by experimentation. As a result, they succeeded in developing a technology for the production of high-quality single-crystal SiC ingot that achieves fine control of the temperature gradient inside the crucible by using heat insulation material to limit radiation in the lateral direction of the crucible and heat conduction in the vertical (axial) direction thereof simultaneously.

Specifically, the present invention is configured as follows.

(1) An apparatus for manufacturing single-crystal silicon carbide comprising:

at least a crucible for accommodating silicon carbide feedstock powder and seed crystal;

heat insulation material installed around the crucible; and a heating device for heating the crucible, wherein the outer profile of the crucible includes at least one region of narrower diameter than a vertically adjacent region, insulation material is also installed in the space left by the diameter difference, and thickness of the insulation material at the narrower diameter region is greater than that of the insulation material at the vertically adjacent region.

(2) An apparatus for manufacturing single-crystal silicon carbide according to (1), wherein the heat insulation material is graphite felt.

(3) An apparatus for manufacturing single-crystal silicon carbide according to (1) or (2), wherein the narrower diameter region of the crucible extends from an upper end of the crucible seed crystal side to a lower end of a crucible crystal growth zone.

(4) An apparatus for manufacturing single-crystal silicon carbide according to (3), wherein a ratio of maximum heat insulation material thickness to minimum heat insulation material thickness (max thickness/min thickness) is 1.5 or greater.

(5) An apparatus for manufacturing single-crystal silicon carbide according to (3), wherein a ratio of maximum heat insulation material thickness to minimum heat insulation material thickness (max thickness/min thickness) is 2 or greater.

The invention apparatus for manufacturing single-crystal silicon carbide enables precise control of the temperature gradient inside the crucible, thereby enabling manufacture of high-quality single-crystal silicon carbide very low in crystal defects.

THE MOST PREFERRED EMBODIMENTS

Figure 1:
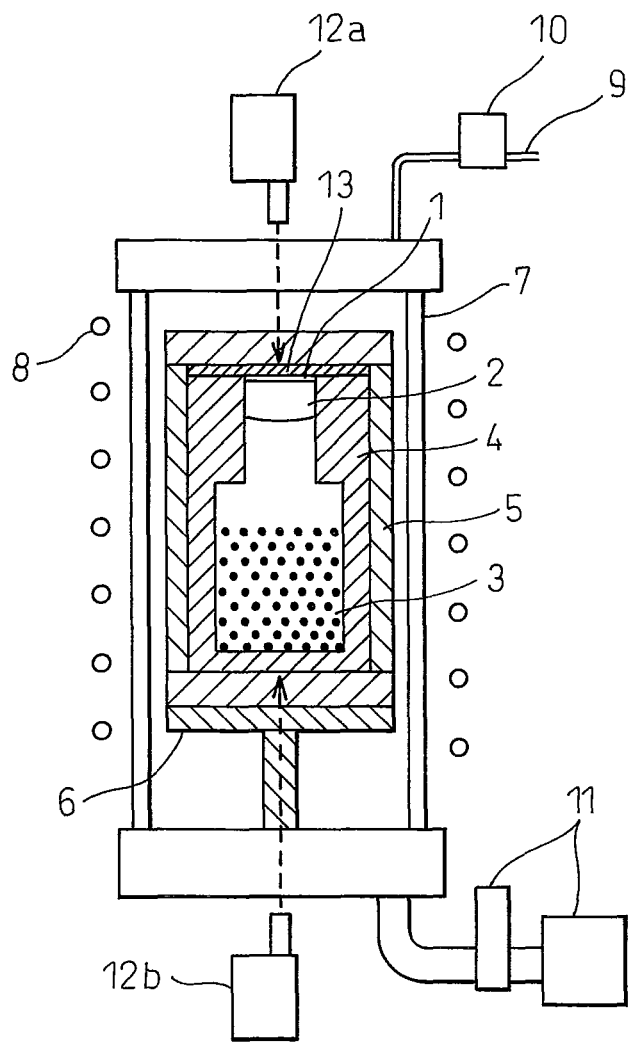
FIG. 1 is a schematic diagram showing an example of the invention apparatus for manufacturing single-crystal silicon carbide.

The apparatus for manufacturing single-crystal silicon carbide of the present invention comprises at least a crucible for accommodating silicon carbide feedstock powder and seed crystal, heat insulation material installed around the crucible, and a heating device for heating the crucible. The outer profile of the crucible (which is the outer diameter of the crucible if it has a circular cross-section) includes at least one region of narrower diameter than a vertically adjacent region or regions and insulation material is also installed in the space left by the diameter difference, i.e., the radial space resulting from the difference between the large-diameter region(s) and the small-diameter region. The heat insulation material installed at the narrow diameter region is therefore thicker than that installed at the adjacent region(s).

As explained earlier, the installation of heat insulation material in the space left by the crucible diameter difference simultaneously limits heat conducted through the crucible wall and heat radiated from the crucible outer wall, so that the temperature of the peripheral region where the heat insulation material is installed can be efficiently increased. In addition, the area affected by the heat insulation material and the degree to which it is affected can be regulated by varying the width and/or thickness of the heat insulation material. In other words, it becomes possible to precisely control the temperature gradient inside the crucible.

The narrow diameter region should preferably be formed at least one location in the region between the upper end of the crucible seed crystal side and the lower end of the crucible crystal growth zone. The provision of one or more narrow diameter regions in the region between the upper end of the crucible seed crystal side and the lower end of the crucible crystal growth zone increases the temperature of the seed crystal peripheral region and the growth crystal peripheral region. As a result, a temperature gradient is established whereby the temperature at the peripheral region of the seed crystal is higher than that at the center thereof, thus forming a convex crystal growth surface. Although polycrystal and various other crystal defects readily arise from the seed crystal peripheral region and the growth crystal peripheral region, the aforesaid control of the temperature gradient inhibits the occurrence of such defects. It therefore very effectively promotes stable growth of single-crystal SiC. The narrow diameter region of the crucible is still more preferably formed at least one location in the region between the upper end of the crucible seed crystal side and the top of the crucible crystal growth zone. This configuration forms a crystal growth surface convex in the growth direction during the early stage of the growth when crystal defects readily occur and further avoids imparting a stronger than necessary temperature gradient during the final stage of the growth, so that thermal stress caused by crystal growth can be minimized to avoid crystal dislocation and cracking.

The structure of the crucible and heat insulation material causes substantially no change the feedstock region at the bottom of the crucible and the amount and rate of sublimation are the same as in the case of the conventional crucible and heat insulation material structure. The crystal growth process can therefore be the same as heretofore.

The narrow diameter region structure opens the way to various types of temperature control. For example, a structure that has one or more narrow sections within the narrow diameter region can be adopted. With such a structure, the high-temperature region of the crucible inner wall can be formed to have a second region of still higher temperature. Giving the boundary between the narrow diameter region and surrounding regions a step-like or grooved shape facilitates the fabrication of the crucible and the heat insulation material. However, if a shape that gradually and continuously changes is desired, this can of course be achieved by using stepping and tapering/flaring in combination.

An effective temperature change can be imparted by making the ratio of maximum heat insulation material thickness to minimum heat insulation material thickness (max thickness/min thickness) preferably 1.5 or greater, more preferably 2.0 or greater. The upper limit of the ratio is not particularly defined because it is inherently determined by the crucible outer diameter and wall thickness. However, a ratio exceeding 20 is undesirable because saturation of the heat insulating effect in the thickness direction makes it uneconomical.

Use of the invention apparatus to grow single-crystal SiC inhibits occurrence of polycrystal at the crystal peripheral region, generation of extraneous polytypes other than the desired one, occurrence of dislocations, and occurrence of ingot cracking, thereby enabling growth of good-quality single-crystal SiC ingots.

Crucibles used in the sublimation growth process are generally made of graphite. The invention crucible can also be made of graphite. Otherwise it can be made of a heat-resistant metal such as tantalum. A crucible that can be divided into a number of separate members is convenient in the aspects of feedstock charging, seed crystal mounting, and grown crystal removal. It is particularly convenient for the seed crystal mounting unit to be formed as a removable cover. Graphite felt is the heat insulation material of choice from the viewpoints of cost and heat resistance. The crucible heating method is not particularly specified. Although a graphite heater or other resistance heater can be used, an inductance heater is preferable for establishing a stable SiC sublimation temperature without heater wear. The induction heater can be of the ordinary type having a pair of inverters and an induction coil.

Unlike the technique of varying the positional relationship between the induction coil and the crucible conventionally used to control the temperature gradient in the sublimation growth process, this invention makes it possible to vary the temperature solely where required at the crystal growth zone without substantially changing the temperature of the feedstock section and other locations where temperature change is not desired. Variation of the positional relationship between the coil and crucible can be utilized in parallel for changing the feedstock maximum temperature location so as to ensure stable sublimation and for conducting crystal growth with still better productivity. Further, the fact that an ordinary induction heater can be used is an advantage in terms of equipment cost. Moreover, the invention does not require the internal structure of the crucible, particularly that of the section where the crystal grows, to be unnecessarily enlarged. It therefore has a high degree of crystal size freedom and can grow long ingots of the required size. As this increases the number of wafers that can be produced per ingot increases, productivity is high.

EXAMPLES

The invention will now be concretely explained with reference to embodiments and comparative examples.

FIG. 1 is a schematic diagram showing an apparatus for manufacturing single-crystal SiC to which the present invention has been applied. A brief explanation of the apparatus for manufacturing single-crystal SiC will be made with reference to FIG. 1. Reference numerals enclosed parentheses in the following are those of members in FIGS. 2 to 4 corresponding to the members in FIG. 1. Crystal growth is conducted by induction heating to sublime the sublimation feedstock (SiC feedstock powder) 3 and recrystallizing the sublimed SiC on the seed crystal (single-crystal SiC) 1. The single crystal SiC 1 constituting the seed crystal is attached to the inner surface of the cover member 13 (30) of a high-purity graphite crucible 4 (23). A number of prior art seed crystal attachment methods have been developed. The present invention does not particularly define the attachment method and any can be used insofar as it is capable of fixing the seed crystal on the cover member 13 (30). The SiC feedstock powder 3 (24) is charged into the crucible 4 (23). Heat insulation material (graphite felt) 5 (25~28) is installed around the crucible 4 (23) (side, top and bottom). The crucible 4 (23) will be explained in detail later.

The crucible 4 (23) and heat insulation material (graphite felt) 5 (25, 26) are mounted on a support 6 (27) inside a double-wall quartz tube 7. The height of the support 6 (27) can be adjusted to regulate the positional relationship between the crucible 4 and an induction coil (work coil 8) installed around the double-wall quartz tube 7. The double-wall quartz tube 7 can be evacuated to a high vacuum ($10^{-2}$ Pa) and controlled in internal pressure by a vacuum pumping device and pressure controller 11. The crucible 4 can be heated to heat the SiC feedstock and seed crystal to the desired temperatures by passing high-frequency electric current through the work coil 8 installed around the double-wall quartz tube 7. Light paths measuring 2 to 4 mm in diameter are formed in the heat insulation material (graphite felt) at the top and bottom of the crucible and the crucible temperature is measured with two-color thermometers 12a (for crucible top temperature measurement) and 12b (for crucible bottom temperature measurement). The temperature of the crucible bottom is treated as the feedstock temperature and the temperature of the crucible top is treated as the seed crystal temperature.

Figure 2:
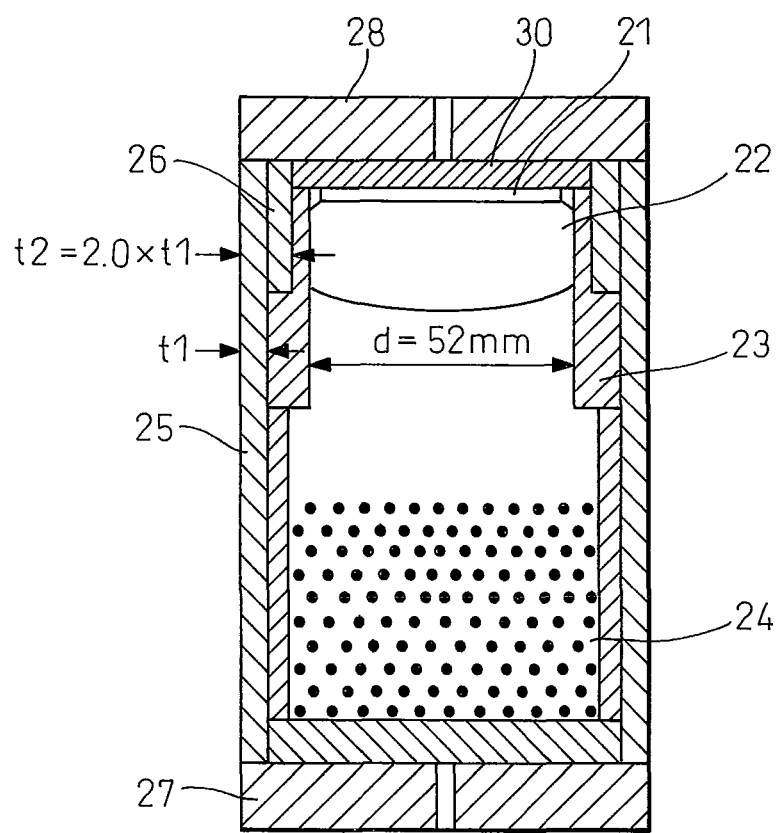
FIG. 2 is a schematic diagram showing the crucible structure in a first embodiment of the invention.
Figure 3:
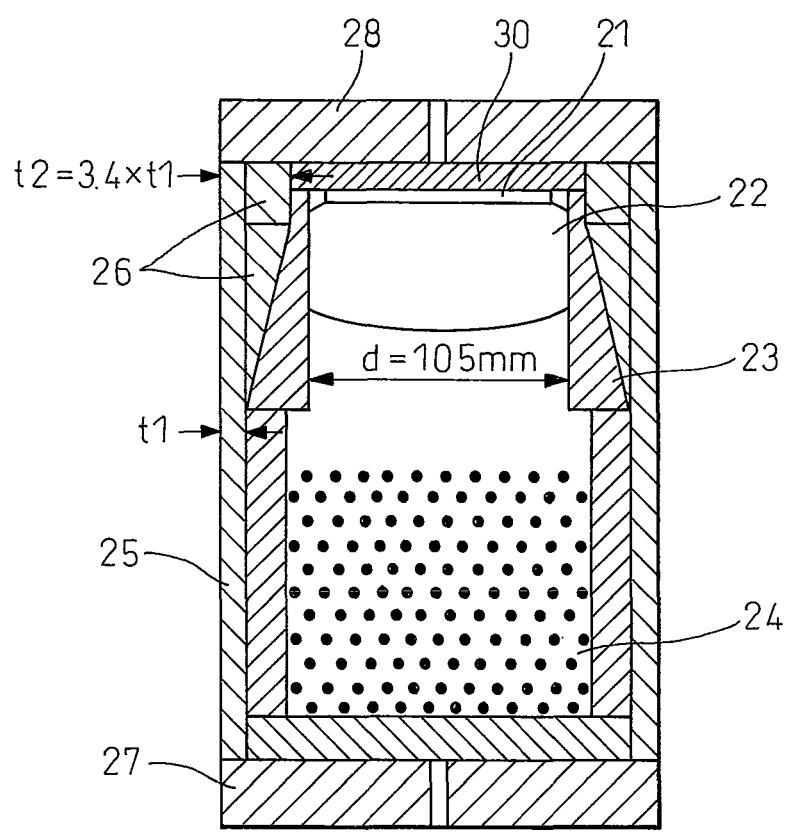
FIG. 3 is a schematic diagram showing the crucible structure in a second embodiment of the invention.
Figure 4:
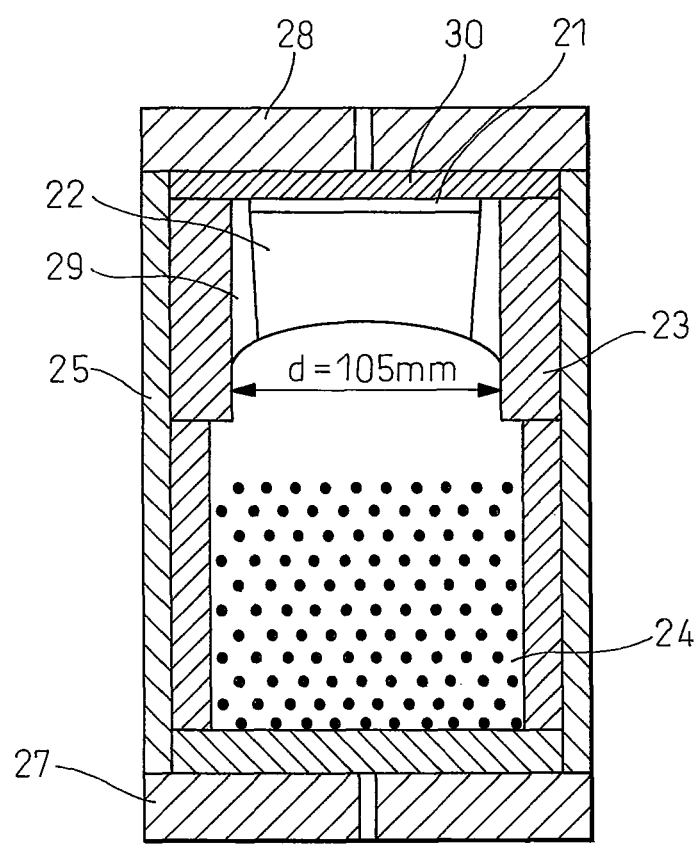
FIG. 4 is a schematic diagram showing the crucible structure in a comparative example.

In FIGS. 2 to 4, reference numeral 21 is assigned to the seed crystal (SiC crystal), 22 to the single-crystal SiC ingot, 23 to the graphite crucible, 24 to the SiC feedstock, 27 to the heat insulation material (graphite felt) installed at the bottom surface of the crucible, and 28 to the heat insulation material (graphite felt) installed at the top surface of the crucible.

Example 1

FIG. 2 is a schematic cross-sectional view of the structure of the crucible used in a first embodiment of the invention. The crucible 23 has a narrow diameter from its upper end to midway of the crystal growth zone. The entire side surface of the crucible is covered with the heat insulation material (graphite felt) 25 and heat insulation material (graphite felt) 26 is additionally provided at the narrow diameter region. The heat insulation material at the narrow diameter region has a thickness of t2. The thickness of the heat insulation material 25 at the thick diameter lower region of the crucible is t1 and t2/t1 is 2.0.

The crucible 23 and heat insulation material (graphite felt) 25, 26 of FIG. 2 were installed at the locations of the crucible 4 and insulation material (graphite felt) 5 of the crystal manufacturing apparatus shown in FIG. 1 and a single crystal ingot 2 (22) was grown by the following process.

First, for use as the seed crystal 1 (21), there was prepared a single-crystal SiC wafer composed of a 6H single polytype having a 51.1 mm diameter [0001] plane and a micropipe density of 13/cm$^2$. The seed crystal was attached to the inner surface of the cover member 13 (30) of the crucible 4 (23) with the Si surface as the growth plane. The interior of the double-wall quartz tube 7 was vacuumized to less than 1.0×$10^{-4}$ Pa with the vacuum pumping device and pressure controller 11. Next, high-purity Ar gas of a purity of 99.9999% or greater was passed through a tube 9 under the control of an Ar gas mass flow controller 10 to maintain the quartz tube internal pressure at $8.0 \times 10^4$ Pa while simultaneously passing high-frequency electric current through the work coil 8 to raise the feedstock temperature to 2400° C. and the seed temperature to 2150° C. The positional relationship between the induction coil and the crucible was adjusted beforehand to establish this temperature relationship. The quartz tube internal pressure was thereafter reduced to the growth pressure of $1.3 \times 10^3$ Pa over a period of about 15 min and this state was maintained for 20 hr to conduct crystal growth.

A 25 mm high, 52 mm diameter single-crystal SiC ingot 2 (22) was obtained by the foregoing process. No polycrystalline SiC adhered to the ingot periphery or the inner wall of the crucible, and no cracks or other mechanical damage was present in the ingot. Analysis of the ingot polytype by X-ray diffraction and Raman scattering verified growth of 6H polytype.

The polytype of a 51.1 mm diameter, 0.4 mm thick [0001] wafer cut from the ingot was analyzed by X-ray diffraction and Raman scattering and found to be 6H single polytype. In addition, the crystal quality of the wafer was evaluated by polarization microscope observation and X-ray topography. The wafer was free of subgrain boundary defects etc. and had a micropipe density of $13/cm^2$.

In order to further examine the effect of the invention, a crucible and heat insulation material of the structure of FIG. 2 was newly prepared and marking crystal growth was conducted with a 51.1 mm [0001] plane seed crystal and SiC feedstock loaded in the crucible. Except for intermittent introduction of nitrogen into the quartz tube, the crystal manufacturing process was conducted in the same manner as in first embodiment. A 26 mm high, 52 mm diameter single-crystal SiC ingot was obtained by the marking growth. The ingot was cut parallel to the growth direction and the growth surface morphology was observed. A growth surface convex in the growth direction was continuously observed from initial growth through the region of heat insulation material thickness t2. The convexity thereafter diminished, with the final shape becoming flat at the middle and slightly convex at the periphery. It was ascertained that a crystal growth surface convex in the growth direction was achieved in the narrow diameter region during the early stage of crystal growth, occurrence of crystal defects during initial crystal growth was inhibited, and the convexity diminished during the latter half of crystal growth.

Example 2

FIG. 3 is a schematic view of the crucible 23 used in second embodiment of the invention. The crucible has a narrow diameter from the upper end to the top of the crystal growth zone, from where it is flared downward. Downward of the lower end of the crystal growth zone, the diameter is uniform. As in the first embodiment, the entire side surface of the crucible is covered with the heat insulation material (graphite felt) 25 and heat insulation material (graphite felt) 26 is additionally provided at the narrow diameter region, including the flared region. The heat insulation material at the narrowest diameter region has a thickness of t2. The thickness of the heat insulation material at the lower region of the crucible where the diameter is uniform is t1 and t2/t1 is 3.4.

The crucible 23 is designed with the aim of enlarging the crystal diameter at the initial stage of growth from the diameter of the seed crystal (100 mm) to 105 mm. The purpose in expanding the diameter to 105 mm is to enable fabrication also of wafers with an off angle different from the seed crystal. Because of the diameter expansion, a strongly convex growth surface shape is required at the initial stage of growth. The value of t2/t1 is therefore greater than in the first embodiment. The outer profile is flared in order to reduce the effect of crucible diameter difference gradually in the growth direction.

The crucible 23 and heat insulation material (graphite felt) 25, 26 of FIG. 3 were installed at the locations of the crucible 4 and insulation material (graphite felt) 5 of the crystal manufacturing apparatus shown in FIG. 1 and a single crystal ingot 2 (22) was grown by the following process.

For use as the seed crystal 1, there was prepared a single-crystal SiC wafer composed of a 4H single polytype having a 100 mm diameter [0001] plane and a micropipe density of $3/cm^2$. The seed crystal was attached to the inner surface of the cover member 13 (30) of the crucible 4 (23) with the C surface as the growth plane. As in the first embodiment, the interior of the double-wall quartz tube 7 was vacuumized to less than $1.0 \times 10^{-4}$ Pa. Next, high-purity Ar gas of a purity of 99.9999% or greater was passed under the control of the Ar gas mass flow controller 10 to maintain the quartz tube internal pressure at $8.0 \times 10^4$ Pa while simultaneously passing high-frequency electric current through the work coil 8 to raise the feedstock temperature to 2400° C. and the seed temperature to 2150° C. The positional relationship between the induction coil and the crucible was adjusted beforehand to establish this temperature relationship. The quartz tube internal pressure was thereafter reduced to the growth pressure of $1.3 \times 10^3$ Pa over a period of about 15 min and this state was maintained for 30 hr to conduct crystal growth.

A 36 mm high, 106 mm diameter single-crystal SiC ingot 2 (22) was obtained by the foregoing process. No polycrystalline SiC adhered to the ingot periphery or the inner wall of the crucible, and no cracks or other mechanical damage was present in the ingot. Analysis of the ingot polytype by X-ray diffraction and Raman scattering verified growth of 6H polytype.

A 100 mm diameter, 0.4 mm thick wafer having a plane orientation 4 degrees off from the (0001) plane in the <11-20> direction was cut from the ingot. The wafer was analyzed by X-ray diffraction and Raman scattering and found to be composed of 4H single polytype. In addition, the crystal quality of the wafer was evaluated by polarization microscope observation and X-ray topography. The wafer was free of subgrain boundary defects etc. and had a micropipe density of $3/cm^2$.

In order to further examine the effect of the invention, a crucible and heat insulation material of the structure of FIG. 3 was newly prepared and marking crystal growth using nitrogen similarly to in the first embodiment with a 100 mm [0001] plane seed crystal and SiC feedstock loaded in the crucible. A 38 mm high, 105 mm diameter single-crystal SiC ingot was obtained by the marking growth. The ingot was cut parallel to the growth direction and the growth surface morphology was observed. A growth surface with very strong convexity in the growth direction was observed in the initial growth region of heat insulation material thickness t2 and the diameter expanded to 105 mm at the stage of about 4 mm growth. The convexity thereafter progressively diminished, with the final shape becoming flat at the middle and mildly convex at the periphery. It was ascertained that a crystal growth surface of relatively strong convex shape in the growth direction was achieved in the narrowest diameter region during initial crystal growth, occurrence of crystal defects was inhibited and the crystal diameter simultaneously expanded during initial crystal growth, and the convexity diminished downwardly with thickening crucible diameter.

Comparative Example

The crucible used in the example for comparison with the present invention is schematically illustrated in FIG. 4. Although the internal structure is the same as that of the crucible 23 shown in FIG. 3, the crucible has no region of reduced outer diameter and the entire side surface of the crucible is covered solely by the heat insulation material (graphite felt) 25. The crucible 23 and heat insulation material (graphite felt) 25 of FIG. 4 were installed at the locations of the crucible 4 and insulation material (graphite felt) 5 of the crystal manufacturing apparatus shown in FIG. 1 and a single crystal ingot was grown by the same process as in the second embodiment.

For use as the seed crystal 1, there was prepared a single-crystal SiC wafer composed of a 4H single polytype having a 100 mm diameter [0001] plane and a micropipe density of 0.8/cm$^2$. The seed crystal was attached to the inner surface of the cover member 13 (30) of the crucible 4 (23) with the C surface as the growth plane. The graphite crucible 4 was mounted on the support 6 and the interior of the double-wall quartz tube 7 was vacuumized to less than $1.0\times10^{-4}$ Pa. Next, high-purity Ar gas of a purity of 99.9999% or greater was passed under the control of the Ar gas mass flow controller 10 to maintain the quartz tube internal pressure at $8.0\times10^4$ Pa while simultaneously passing high-frequency electric current through the work coil 8 to raise the feedstock temperature to 2400° C. and the seed temperature to 2150° C. The positional relationship between the induction coil and the crucible was adjusted beforehand. The quartz tube internal pressure was thereafter reduced to the growth pressure of $1.3\times10^3$ Pa over a period of about 15 min and this state was maintained for 30 hr to conduct crystal growth.

A 43 mm high, 105 mm diameter single-crystal SiC ingot 22 was obtained by the foregoing process. Polycrystal 29 formed at the ingot periphery and constituted the maximum height of the ingot. Upon removal of the ingot, SiC polycrystal was also found to be adhered to the inner wall of the crucible. The ingot also sustained cracks that extended from starting points in the polycrystal region. The cracks extended to the single crystal region at the ingot center. Analysis of the polytype of the single crystal region at the center of the ingot by X-ray diffraction and Raman scattering verified growth of two polytypes, namely, 4H and 6H.

The presence of the polycrystal made it impossible to cut 100 mm diameter wafer from the ingot. Instead, therefore, a 60 mm diameter, 0.4 mm thick [0001] plane wafer was cut from the center single crystal region for evaluation. The wafer was analyzed by X-ray diffraction and Raman scattering and found to be composed of a mixture of two polytypes, 6H and 4H. In addition, the crystal quality of the wafer was evaluated by polarization microscope observation and X-ray topography. Many subgrain boundary defects attributable to different polytype interfaces were observed and the micropipe density was about 241/cm$^2$.

Also in this Comparative Example, a crucible and heat insulation material of the structure of FIG. 4 was newly prepared and marking crystal growth was conducted similarly to in the embodiments with a 100 mm [0001] plane seed crystal and SiC feedstock loaded in the crucible. Polycrystal also formed at the peripheral region during marking growth and a 39 mm high, 106 mm diameter single-crystal SiC ingot with a maximum height constituted by the polycrystal region was obtained. The ingot was cut in the growth direction and the growth surface morphology was observed. Polycrystal had formed from the crucible wall at the seed crystal peripheral region during initial growth. The growth surface morphology included undulations. Although the center during initial growth was moderately convex in the growth direction, the peripheral region rose sharply. It was confirmed that at the early stage of crystal growth a state conducive to occurrence of crystal defects existed owing to the low temperature of the seed peripheral region.

The invention claimed is:

1. An apparatus for manufacturing single-crystal silicon carbide, said apparatus comprising:
   at least a crucible for accommodating silicon carbide feedstock powder and seed crystal;
   heat insulation material installed around the crucible; and
   a heating device for heating the crucible, wherein the crucible is heated by passing high-frequency electric current through a work coil installed around the crucible,
   wherein:
   the outer profile of the crucible includes at least one region of narrower diameter than a vertically adjacent region at a vertically adjacent higher region,
   the insulation material is also installed in the space left by the diameter difference,
   a thickness of the insulation material at the narrower diameter region is greater than that of the insulation material at the vertically adjacent region, and
   a ratio of maximum heat insulation material thickness to minimum heat insulation material thickness (max. thickness/min. thickness) is 1.5 or greater.

2. An apparatus for manufacturing single-crystal silicon carbide, said apparatus comprising:
   at least a crucible for accommodating silicon carbide feedstock powder and seed crystal;
   heat insulation material installed around the crucible; and
   a heating device for heating the crucible, wherein the crucible is heated by passing high-frequency electric current through a work coil installed around the crucible,
   wherein
   the outer profile of the crucible includes at least one region of narrower diameter than a vertically adjacent region at a vertically adjacent higher region,
   the insulation material is also installed in the space left by the diameter difference, and
   a thickness of the insulation material at the narrower diameter region is greater than that of the insulation material at the vertically adjacent region, and
   wherein:
   the crucible is provided with a cover member, to an inner surface of which a seed crystal is attached at a top side thereof,
   the crucible is provided with a portion in which silicon carbide feedstock is charged at a bottom side thereof, and
   a ratio of maximum heat insulation material thickness to minimum heat insulation material thickness (max. thickness/min. thickness) is 1.5 or greater.

3. An apparatus for manufacturing single-crystal silicon carbide according to claim 1 or 2, wherein the heat insulation material is graphite felt.

4. An apparatus for manufacturing single-crystal silicon carbide according to claim 3, wherein the narrower diameter region of the crucible extends from an upper end of the crucible seed crystal side to a lower end of a crucible crystal growth zone. minimum heat insulation material thickness (max thickness/min thickness) is 2 or greater.

5. An apparatus for manufacturing single-crystal silicon carbide according to claim 3, wherein a ratio of maximum heat insulation material thickness to minimum heat insulation material thickness (max thickness/min thickness) is 2 or greater.

6. An apparatus for manufacturing single-crystal silicon carbide according to claim 1 or 2, wherein the narrower diameter region of the crucible extends from an upper end of the crucible seed crystal side to a lower end of a crucible crystal growth zone.

7. An apparatus for manufacturing single-crystal silicon carbide according to claim 6, wherein a ratio of maximum heat insulation material thickness to minimum heat insulation material thickness (max thickness/min thickness) is 2 or greater.

8. An apparatus for manufacturing single-crystal silicon carbide, said apparatus comprising:
- a crucible for accommodating silicon carbide feedstock powder and seed crystal;
- heat insulation material around the outside of the crucible; and
- a heating device for heating the crucible, wherein the crucible is heated by passing high-frequency electric current through a work coil installed around the crucible, wherein:
- an outer profile of the crucible includes a small-diameter region having a narrower diameter than a large-diameter region located vertically adjacent to the small-diameter region,
- heat insulation material is installed in a radial space resulting from a diameter difference between the large-diameter region and the small-diameter region,
- a thickness of the insulation material at the small-diameter region is greater than that of the insulation material at the large-diameter region, and
- a ratio of maximum heat insulation material thickness to minimum heat insulation material thickness (max. thickness/min. thickness) is 1.5 or greater.

* * * * *